United States Patent [19]

Merritt et al.

[11] Patent Number: 5,353,600
[45] Date of Patent: Oct. 11, 1994

[54] SOLAR POWERED THERMOELECTRIC COOLED COSMETIC CASE

[75] Inventors: Thomas D. Merritt, N. Miami Beach, Fla.; James R. Merritt, Northridge, Calif.

[73] Assignee: Flori-Cal Inc., Miami, Fla.

[21] Appl. No.: 159,385

[22] Filed: Nov. 30, 1993

[51] Int. Cl.$^5$ .............................................. F25B 21/02
[52] U.S. Cl. .................................. 62/3.7; 62/3.62; 62/235.1; 62/457.9
[58] Field of Search ................... 62/3.2, 3.3, 3.6, 3.5, 62/3.7, 235.1, 3.62, 457.9, 457.7, 457.1

[56] References Cited

U.S. PATENT DOCUMENTS 3,732,702  5/1973  Desch ..................................... 62/3.6
4,981,019  1/1991  Hicks et al. ........................ 62/235.1

Primary Examiner—John M. Sollecito

[57] ABSTRACT

A solar and battery powered thermoelectrically cooled cosmetic bag constructed of an insulative material sandwiched between two layers of thermally conductive and reflective material including a thermoelectric module. Said Thermoelectric module comprising hot and cold surfaces which are in thermal communication with the interior and exterior thermally conductive layers. Photo voltaic cells on the exterior of the bag and thermocouples in thermal communication with the exterior thermally conductive layer of the bag charge a rechargeable battery located within the bag. A thermistor controlled proportional circuit allows current to flow from the photo voltaic cell array and rechargeable battery to the thermoelectric module which creates and maintains a predetermined temperature setting within the interior of the cosmetic bag.

3 Claims, 3 Drawing Sheets

SOLAR POWERED THERMOELECTRIC COOLED COSMETIC CASE

BACKGROUND OF THE INVENTION

The typical cosmetic carrying case or bag has been found to be inadequate in that certain cosmetics, composed of materials having relatively low melting temperatures, are rendered useless when exposed to such temperatures. Maintaining an Ideal temperature range within the small volume of space within the cosmetic bag is therefore a most desireable option. Much art has been devoted to producing insulative fabrics and plastics which are used in a variety of containers and clothing. Generally the containers are used for transporting perishable food items and the clothing is used for outdoor wear where exposure to large temperature changes is likely. All of these devices, however are passive devices. They characteristically maintain a temperature by offering resistance to heat transfer. Often, in the case of the containers, smaller containers of frozen solutions are placed inside of the container to produce lower initial temperatures for the interior of the container. However, when exposed to higher ambient temperatures, the interior of the container will, over time, absorb enough heat to reach ambient. One exception is a thermoelectrically cooled refrigerator marketed commercially which requires the use of an external power source. Thermoelectric refrigeration is based on the Peltier effect, a reciprocal of the Seebeck effect which was discovered early in the nineteenth century. Both effects deal with the interrelationship of heat energy and electrical energy in a circuit which contains a junction of dissimilar materials, primarily bismuth and tellurium. The modern thermoelectric module lends itself ideal for the purpose of cooling small well inslated spaces such as those within the small cosmetic carrying cases and bags in use by the contemporay individual. The solar powered temperature regulated cosmetic bag described herein uses a novel configuration of solid state power generating devices, thermoelectric cooling modules, and switching devices integrated with extremely efficient insulation and thermal reflective materials in such a fashion as to provide sustained temperature regulation which can be easily carried or worn by a single individual without difficulty. The instant invention will embody an apparatus and a method of maintaining a controlled environment which does not attain ambient temperatures as is the case with well known simple insulated containers and garments, thereby fulfilling a need long sought for in the art.

SUMMARY OF THE INVENTION

Figure 1:
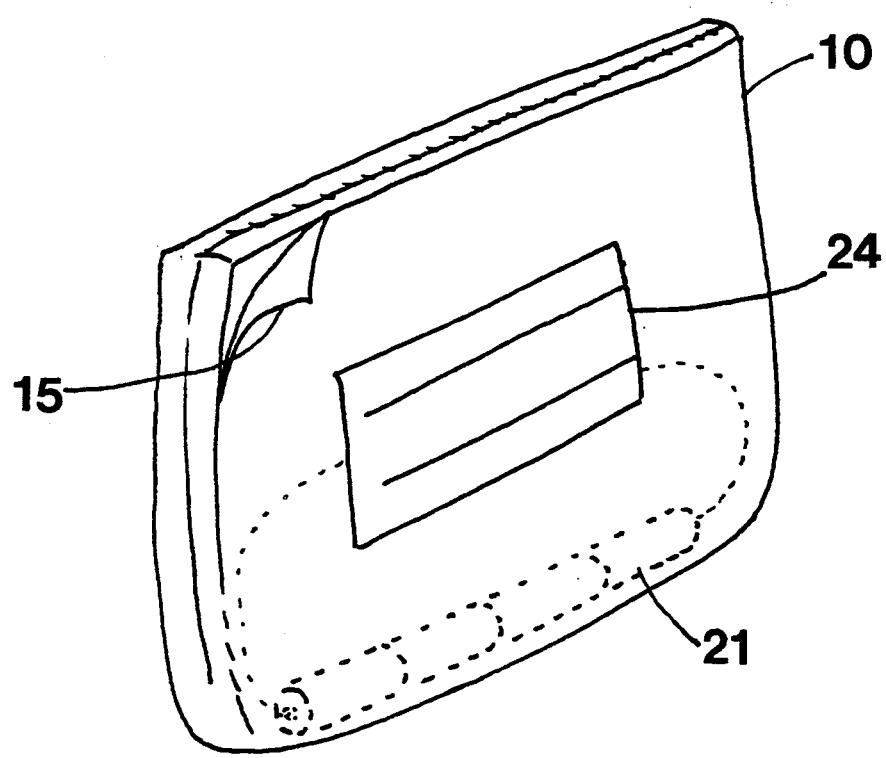
FIG. 1 is: a schematic view of the inventive solar powered cosmetics bag
Figure 2:
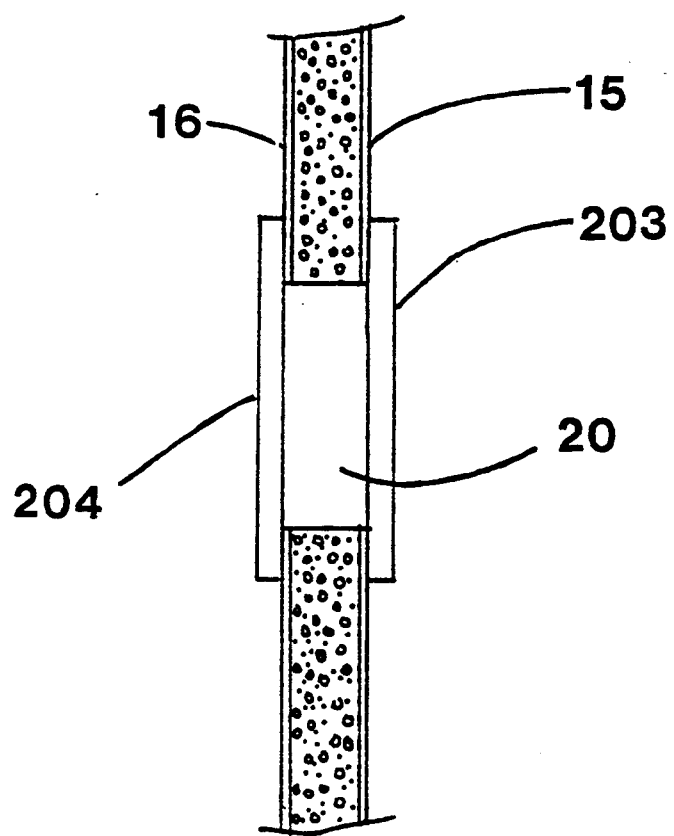
FIG. 2 is: a cross sectional view of the cosmetics bag insulative wall

The present invention relates to a cosmetics case or bag in combination with a thermoelectrical refrigeration device used to effect temperature within said case to a predetermined setting. Said cosmetics bag is constructed of a layer of insulative material such as or similar to dosed cell neoprene foam rubber. This material is formed in such a way as to create a container with an interior and an exterior. The exterior and interior surfaces will have a thermally conductive material covering part or all of their area. The thermally conductive material will serve as heat absorbing medium and heat rejection medium for the thermoelectric device. The relatively hot element of the thermoelectric device will be in contact with the thermal conductive material on the exterior of the container, and the relatively cool element will be in contact with the conductive material on the interior surface. A thermoelectric device is placed in an aperature cut into the insulating material sandwiched between the two heat conducting materials. There is an advantage to cover the hot side of the thermoelectric module with a material with a high degree of thermal transmissivity such as a material marketed under the trade name, Mylar. The mylar or a product similar also reflects a large quanta of radiant energy from the sun. This contributes to the insulating value of the material from which the container is constructed. The cosmetics bag employs a closing or sealing device which allows a person to establish a unique environment for the articles carried or stored. When opened, it will allow access to its interior. Included is an electrical circuit comprising a storage means (battery), and one or more thermoelectric modules which exhibit the Peltier effect. This effect is created when an electric current is passed through the thermoelectric refrigeration module. The thermoelectric module is made from two elements of semi conductor, primarily Bismuth Telluride, heavily doped to create either an excess or deficiency of electrons. A switch, when closed, allows an electric current to pass through the module causing one junction to become cold, therefore capable of absorbing heat and the other junction to become hot, as the heat absorbed is pumped to that side. The electric input provided by an electrical storage means or battery is proportionally controlled by a thermister located in the circuit, mounted in the interior of the container. Said thermister, which is a solid state device capable of impeding or allowing the flow of electric current in response to the temperature within the interior of the bag, is in circuit with operational amplifier (op-amp) circuit elements which amplify the difference between thermistor resistance and set point temperatures and process the resulting signal, providing an electronic feedback means between a power source (electric storage means) and the thermoelectric module. In the preferred embodiment a rechargeable cell or plurality of cells is employed as a power source for said thermoelectric modules. Said circuit also comprises at least one or a plurality of photovoltaic cells positioned on the exterior of the container for the purpose of recharging or replenishing the electricial charge in said electrical storage means. The circuit also includes a thermocouple device which is bonded to the thermally conductive material located on the exterior of the storage chamber which, as mentioned above, is being used as a heat sink for the hot surface of the thermoelectric device. The thermocouple will act as a transducer by converting a portion of the heat energy into electric current as a consequence of the Seebeck effect, which is the inverse of the Peltier effect by which the thermoelectric modules exhibit cooling effect. The thermocouple is in an electrical circuit with the electric storage means and is connected in parallel with the photovoltaic cells providing a plurality of recharging means for the electric storage means. In another embodiment an external electrical connection, for connection to an electrical outlet, is in electrical communication with the storage batteries. This electrical connection can be used to provide yet another means of recharging the power source when the photovoltaic cells and thermocouples are not operational. When the proportional control circuit containing the thermistor senses that the interior temperature of the chamber exceeds the preset temperature required, the circuit permits current to flow from the power source (electrical storage means) to the thermoelectric module. Heat is transferred from the interior thermally conductive layer to the outer thermally conductive layer. Some of this heat is transduced by the thermocouple into electrical energy which flows into the electrical storage means. The rest of the heat is dissipated into the ambient environment. The photovoltaic cells transduce light energy into electrical energy which flows into the electrical storage means. When the proportional circuit senses that the preset temperature exceeds the interior temperature of the bag, the circuit discontinues the flow of current from the power source to said thermoelectric module. The thermocouple transduces the residual heat in the outer thermally conductive layer from the thermoelectric module and the photovoltaic cells continue to transduce ambient light energy effectively recharging the electrical storage means, which will again discharge when required by said proportional control circuit.

It is accordingly an object of the present invention to to provide an apparatus and a method by which a predetermined temperature can be maintained within an enclosure such as a cosmetic bag or case by power from the sun and by heat.

It is another object of the present invention to provide an apparatus and a method by which the interior of a cosmetic bag is thermostatically controlled by sub miniature solid state components.

Another yet further object of the invention is to transport temperature sensitive materials or to cool various body parts.

The above and yet other objects and advantages of the present invention will become apparent from the hereinafter set forth Detailed Description of the invention, the Drawings, and Claims appended herewith.

DETAILED DESCRIPTION OF THE INVENTION

Figure 3:
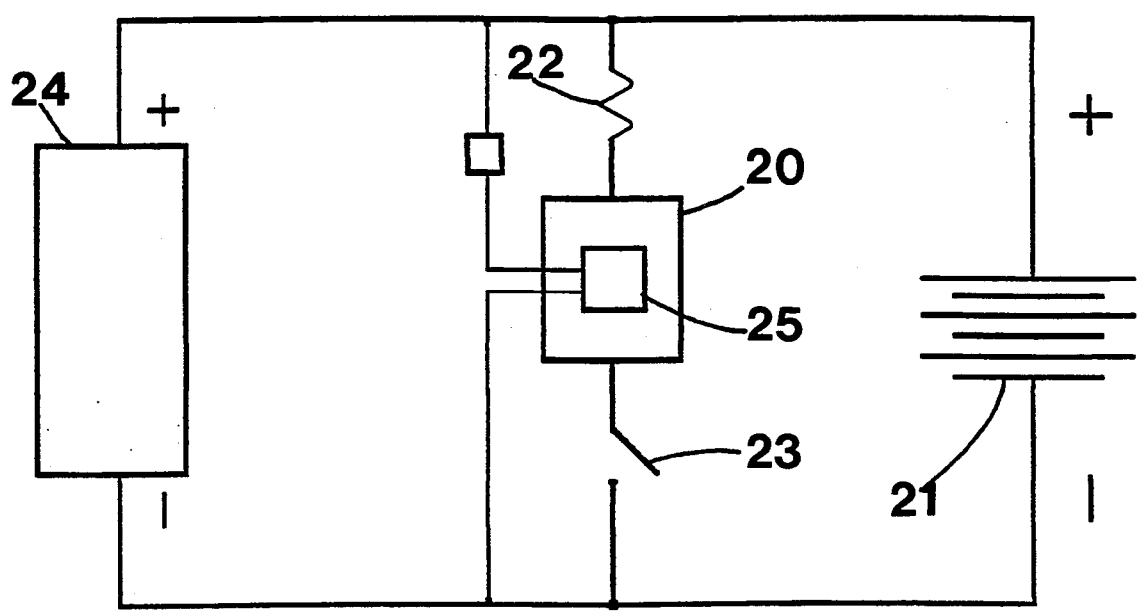
FIG. 3 is: a schematic of the electrical circuit employed in the invention

With reference to FIG. 1 the embodiment illustrated is a pouch or cosmetic bag 10 which is intended to be carried on the person. Bag 10 is constructed of an insulative material coated or covered with a heat conducting material forming an exterior surface 15 and an interior surface 16. Inserted within an opening in beg 10 is thermoelectric module 20 which serves as a heat pumping means. Heat is absorbed from within the interior of beg 10 by interior surface 16 in thermal communication with relatively cold surface 204 of module 20. Heat is transferred to surface 203 of module 20. This is achieved by allowing a current of electricity to flow from electrical storage means 21. Heat absorbed from interior surface 16 is now rejected by exterior surface 15 which is in thermal communication with relatively hot surface 203. It should be understood that exterior surface 15 is constructed of a material which also has high reflective characteristics for radiant heat, thus improving the insulative qualities of said insulative material of which the invention is constructed. Electrical storage means 21 is also in electric communication with at least one photovoltaic cell 24 mounted on the exterior surface of bag 10. Photovultaic cell 24 is utilized for recharging electric storage means 21 before, during, or after use. With reference to FIG. 3 which is a schematic of the electrical circuit in the preferred embodiment electrical storage means 21 has a positive and negative pole is in electrical communication wth photovoltaic cell 24 also with a positive and negative pole. During operation switch 23 is closed allowing current to flow through module 20 causing a refrigeration effect. A thermistor 22 sensitive to temperature regulates the amount of current allowed to flow through module 20. In thermal communication with module 20 is thermocouple 25 which is intended to convert at least a portion of heat rejected at surface 203 into electricity. Current produced at thermocouple 25 is introduced back into the circuit. The combination of photovoltaic call 24, thermistor 22, and thermocouple 22 will ease the drain on storage means 21. When switch 23 is open photovoltaic cell 24 continues to charge storage means 21.

Accordingly, while there have been shown and described the preferred embodiments of the present invention, it will be understood that the invention may be embodied otherwise than as specifcally illustrated or described and that within said embodiments certain changes in the detail and construction, and the form of arrangement of the parts may be made without departing from the underlying idea or principles of this invention within the scope of the appended claims.

Having thus described our invention, what we claim as new, useful and non obvious and, accordingly, secure by Letters Patent of the United States is:

1. A cosmetics bag including means to provide and replenish an electric power source for a thermoelectric refrigeration device whereby the temperature in said cosmetics bag can be maintained at a predetermined level comprising:
   a) a means for opening and closing said cosmetics bag;
   b) a rechargeable electric storage device;
   c) a thermoelectric device in electrical feedback communication with said storage device said thermoelectric device having its relatively cold element inside of said cosmetics bag and said thermoelectric device having its relatively hot side located exterior of said cosmetics bag;
   d) means for detecting temperature changes in said cosmetics bag and controlling temperature by interrupting electric current to said thermoelectric device;
   e) a photovoltaic device mounted exterior of said cosmetics bag in electrical communication with said storage device providing means to produce electrical power to recharge said storage device;
   f) a thermocouple device in direct contact with said thermoelectric refrigeration device providing means to enable a portion of heat being transferred to said hot element to be used to generate electric power to replenish electric power to said storage device.

2. The cosmetics bag recited in claim 1 further comprising an exterior covering of heat conducting material which will act as a heat sink for said thermoelectric device thereby improving the performance of said thermoelectric device.

3. The cosmetics bag recited in claim 1 wherein said means for controlling temperature within said cosmetics bag comprises thermistor responding to changes in temperature allows more or less current through an electrical circuit where by current draw of said thermoelectric device is reduced at a predetermined temperature set point.

* * * * *